(12) United States Patent
Tumminaro et al.

(10) Patent No.: US 8,258,822 B2
(45) Date of Patent: Sep. 4, 2012

(54) DRIVER CIRCUIT AND METHOD FOR REDUCING ELECTROMAGNETIC INTERFERENCE

(75) Inventors: Salvatore Tumminaro, Marianopoli (IT); Salvatore Giombanco, Cassaro (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 13/073,760

(22) Filed: Mar. 28, 2011

(65) Prior Publication Data

US 2011/0175650 A1 Jul. 21, 2011

Related U.S. Application Data

(63) Continuation of application No. 12/328,540, filed on Dec. 4, 2008, now Pat. No. 7,936,189.

(51) Int. Cl.
*H03K 3/00* (2006.01)
(52) U.S. Cl. .......................................... 327/108
(58) Field of Classification Search ........................ None
See application file for complete search history.

(56) References Cited

U.S. PATENT DOCUMENTS

| | | | | |
|---|---|---|---|---|
| 5,548,240 A * | 8/1996 | Bayer | ........................... | 327/432 |
| 5,841,297 A * | 11/1998 | Bayer et al. | ..................... | 326/83 |
| 5,977,814 A * | 11/1999 | Ishii | ............................... | 327/434 |
| 6,057,728 A | 5/2000 | Igarashi | | |
| 6,100,742 A * | 8/2000 | Erckert | .......................... | 327/374 |
| 6,320,449 B1 | 11/2001 | Capici et al. | | |
| 6,577,171 B1 * | 6/2003 | Filippo et al. | ................. | 327/108 |
| 6,873,201 B2 | 3/2005 | Panhofer | | |
| 7,362,147 B2 * | 4/2008 | Rebholz-Goldmann | ..... | 327/108 |
| 7,408,398 B2 | 8/2008 | Sander | | |
| 2006/0006922 A1 | 1/2006 | Sander | | |
| 2006/0290388 A1 | 12/2006 | Tolle et al. | | |

* cited by examiner

*Primary Examiner* — Lincoln Donovan
*Assistant Examiner* — Khareem E Almo
(74) *Attorney, Agent, or Firm* — Seed IP Law Group PLLC

(57) ABSTRACT

An apparatus and a method switch a load through a power transistor. The apparatus includes: a first current generator for generating a current to charge a capacitance of a control terminal of the power transistor during power on of the power transistor; a second current generator for generating a current to discharge the capacitance during power off of the power transistor. The apparatus is equipped with control circuitry having a storage element for storing a voltage value representative of the potential difference between the control terminal and a conduction terminal of the power transistor when the power transistor operates in the saturation region and a discharge circuit for generating an additional current to discharge the capacitance during the power-off process. The additional current is a function of the potential difference of the control terminal and the stored voltage value from the conduction terminal.

31 Claims, 7 Drawing Sheets

DRIVER CIRCUIT AND METHOD FOR REDUCING ELECTROMAGNETIC INTERFERENCE

BACKGROUND

1. Technical Field

The present disclosure relates to a driver circuit and method for reducing electromagnetic interference (EMI) without affecting communication delays in a driver stage.

More particularly, the present disclosure relates to a driver circuit and method for switching a load through a power transistor.

2. Description of the Related Art

External inductive loads 1 connected to a high voltage power line Vin are known to be driven, see FIGS. 1a and 1b, using a switch 2 and an appropriate driver stage 3.

The switch 2 may be commonly implemented, if allowed by the manufacturing conditions and technology, as an integrated MOSFET transistor, such as a power MOSFET or an IGBT.

Particularly, referring to FIG. 1a, in case of low-side drive, the transistor 2 has:

the gate terminal driven by two current generators I1 and I2 that are part of the driver stage 3, which are in turn controlled by respective control signals S1 and S2,
the grounded source terminal, and
the drain terminal connected to the external inductive load 1.

Otherwise, referring to FIG. 1b, in case of high-side drive, the transistor 2 has:

the gate terminal driven by two current generators I1 and I2 that are part of the driver stage 3, which are in turn controlled by respective control signals S1 and S2,
the source terminal connected to the reference terminal of the driver stage and to the external inductive load 1, and
the drain terminal connected to high-voltage power supply Vin.

Still referring to such FIGS. 1a and 1b, there are also shown the capacitances of the transistor between the gate terminal and the source terminal $C_{GS}$ and between the gate terminal and the drain terminal $C_{GD}$, whose effects on operation will be more apparent from the following description.

For simplicity, reference will be made herein to the low-side drive case, considering that this description may also relate to high-side driving.

As is known to those of ordinary skill in the art, MOSFET devices have been increasingly used in electronic circuits due to their being easily driven and to their ability of handing high currents and voltages at high switching frequencies.

Nonetheless, power dissipation in the power transistor 3 may be reduced by increasing the switching speed, but this involves increased generation of electromagnetic interference (EMI).

When voltage and current slopes are increased during switching transients, the EMI level also increases, wherefore the design of any power driving stage requires a reasonable compromise of the characteristics of the device, power losses and EMI.

The switching speed of a MOSFET device is strictly related to the amount of the charge that is transmitted to the dynamic capacitance within the gate terminal $C_G$, whose value is equal to the sum of those of the dynamic capacitances situated between the gate and source and drain terminals, i.e. $C_G = C_{GS} + C_{GD}$.

Furthermore, it should be noted that by imparting an appropriate form to the gate current $i_G$, voltage slopes may be controlled at the drain terminal, in case of low-side drive and at the source terminal, in case of high-side drive.

Considering the low-side case (see FIG. 1a), the drain voltage $V_D$ may be gradually increased and decreased by adjusting, during design, the current value that is used for charging and discharging the dynamic input capacitance $C_G$ of the power MOSFET.

Although the capacitance $C_{GS}$ is an important parameter, the capacitance $C_{GD}$ is much more significant, because it is a nonlinear capacitance, that changes as a function of the voltage at the drain terminal.

The effect of the capacitance $C_{GD}$ is similar to the Miller effect (which is well known to the skilled person and will not be further described herein) and affects the total input impedance of the power MOSFET 2, wherefore the total dynamic input capacitance is generally higher than the sum of static capacitances.

Therefore, the capacitance $C_{GD}$, which is lower than the capacitance $C_{GS}$ in its static value, may assume a dynamic value about 20 times as high as the capacitance $C_{GS}$.

This means that the capacitance $C_{GD}$ or "Miller" capacitance typically has a higher charge than the static input capacitance.

Therefore, the upslope and downslope time of the drain voltage may be controlled using the Miller effect.

The slope of the drain voltage $V_D$ depends on the current generated or absorbed at the gate of the power transistor 2, i.e. on the value of the gate current $i_G$, which may be expressed by the following relation:

$$i_G = i_{CGS} + i_{CGD} = \frac{d(C_{GS} \cdot v_{GS})}{dt} + \frac{d(C_{GD} \cdot v_{GD})}{dt} \quad (1)$$

where $i_{CGS}$ and $i_{CGD}$ represent the currents flowing into the capacitances $C_{GS}$ and $C_{GD}$ respectively.

As a consequence of the Miller effect, the voltage $V_{GS}$ between the gate and source terminals may be deemed to be constant and the equation (1) may be rewritten as:

$$\begin{aligned} i_G &= C_{GD_{Miller}} \cdot \frac{dv_{GD}}{dt} \\ &= C_{GD_{Miller}} \cdot \frac{d(v_{GS} - v_{DS})}{dt} \\ &= -C_{GD_{Miller}} \cdot \frac{dv_{DS}}{dt} \end{aligned} \quad (2)$$

Furthermore, the voltage between the gate and the source may be determined in this state.

Particularly, since the gate current $i_G$ is also constant, according to the input transfer feature, i.e. according to the following relation:

$$i_D = g_m \cdot (v_{GS} - v_{TH}),$$

where $i_D$ is the drain current, $g_m$ is the transconductance of the transistor and $v_{TH}$ is the threshold voltage, the voltage $V_{GS}$, Miller may be rewritten as follows:

$$v_{GS_{Miller}} = \frac{i_D}{g_m} + v_{TH} \quad (3)$$

A variety of circuit implementations are known in the art, which are designed to utilize the Miller effect for switching speed control.

Particularly, in one implementation, the gate terminal of the power transistor is driven via a constant current source, by limiting the voltage $V_{GS}$ charging and discharging speed, thereby reducing the drain voltage slope.

Nonetheless, this gate terminal driving technique involves a high power-off delay Td, wherefore this technique cannot be used in power applications, whose specifications require fast switching times.

Thus, also referring to FIG. 2, which shows the switching waveforms with the inductive load 1 connected to the drain terminal of the MOSFET transistor, if the control signal V(QG) of the driver stage becomes so low that the MOSFET is powered off, a constant current is absorbed and the voltage V(GATE) at the gate terminal discharges slowly.

During this period of time Td, the drain current I (DRAIN) keeps on increasing, thereby causing consumptions and delays in MOSFET transistor switching, until the V(GATE) reaches the Miller zone.

Now, the voltage at the drain terminal V(DRAIN) increases to the maximum value allowed by the power supply voltage Vin.

BRIEF SUMMARY

One embodiment provides a solution for reaching in as little time as possible the Miller zone, i.e. that transistor operation zone in which the voltage $V_{GS}$, known as "Miller" voltage $V_{GS}$,Miller, is substantially constant, wherefore a constant current can be absorbed from the gate, to control the voltage slope at the drain terminal.

One embodiment is a driver circuit for switching a load through a power transistor as defined in claim 1.

One embodiment is a driving method for switching a load through a power transistor as defined in claim 7.

One embodiment provides a driver circuit that optimizes current absorption by the driver stage, and can reduce delays in discharging the gate capacitance.

Furthermore, one embodiment provides compensation for any threshold voltage changes caused by the various manufacturing processes that are used to fabricate the power MOSFET transistor.

BRIEF DESCRIPTION OF THE SEVERAL VIEWS OF THE DRAWINGS

The characteristics and advantages of the present disclosure will appear from the following detailed description of one practical embodiment, which is illustrated without limitation in the annexed drawings, in which:

FIG. 2 shows switching waveforms for the driver circuit as shown in FIG. 1a;

DETAILED DESCRIPTION

Figure 3:
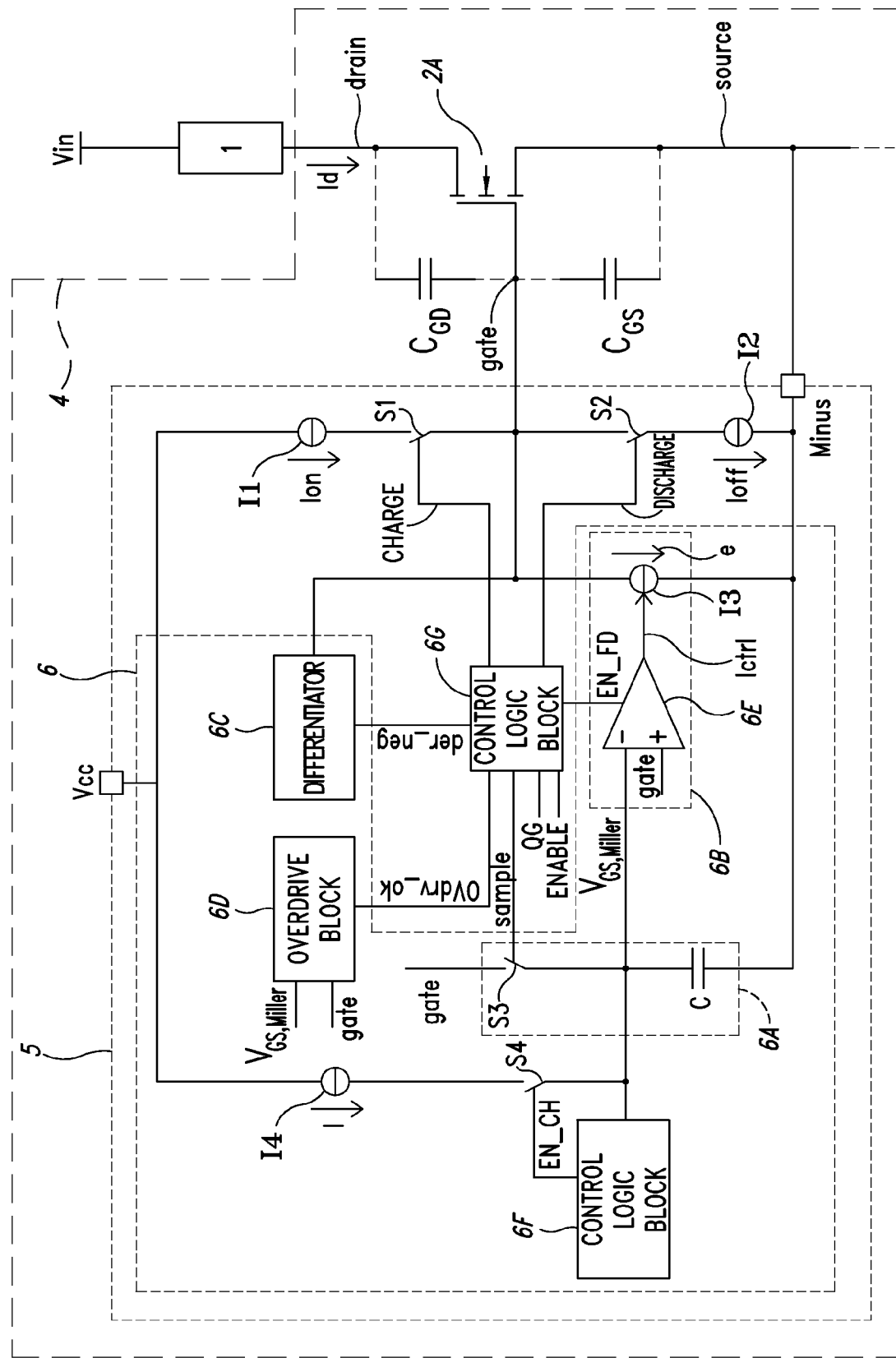
FIG. 3 is a block diagram of the driver circuit of one embodiment.
Figure 4:
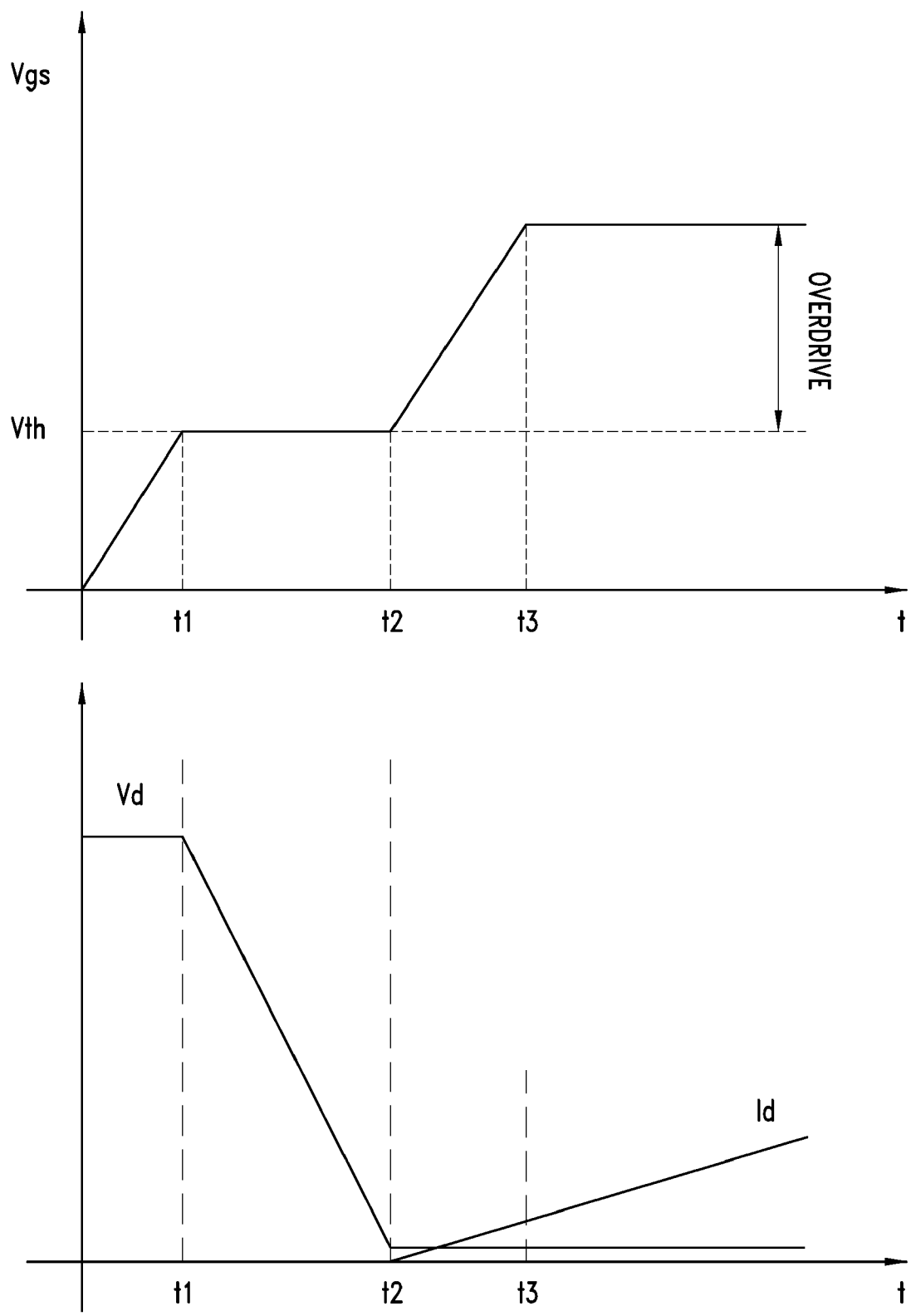
FIGS. 4 and 5 show switching waveforms for the driver circuit of FIG. 3, during the power-on step and the power-off step respectively.
Figure 5:
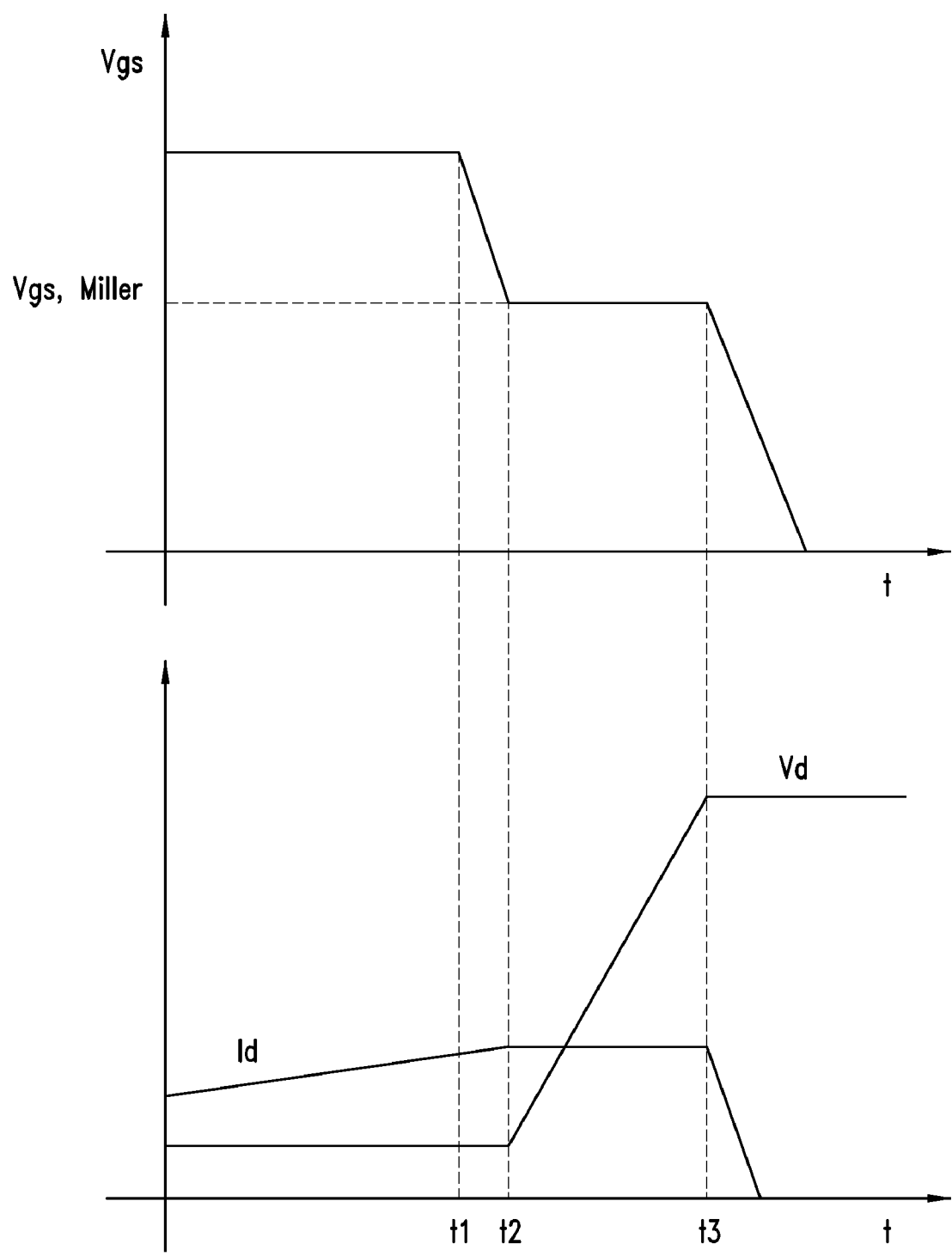

Referring to the accompanying FIGS. 3 to 5, in which the elements described above are designated by identical numerals, a power circuit 4 for driving the load 1 is shown. The power circuit 4 includes a power transistor 2A, e.g. of MOSFET type, and a driving circuit 5 for controlling the power transistor 2A.

The driver circuit 5 comprises:
a first current generator I1 controlled by a first CHARGE signal for generating a current Ion to charge a capacitance of the drive terminal $C_G$ of the transistor 2A during power on said power transistor;
a second current generator 12 controlled by a second DISCHARGE signal for generating a current Ioff to discharge the capacitance of the gate terminal $C_G$ of said power transistor during a power-off step.

The power transistor 2A also has its source terminal connected to ground and the drain terminal connected to the external inductive load 1.

Advantageously, the driver circuit 5 is equipped with control circuitry 6, which is electrically coupled to said second current generator 12 and said gate terminal of said power transistor, to control power on and off of the transistor.

For this purpose, the control circuitry 6 receives a voltage that is lower than the voltage Vin supplied to the load 1 and particularly comprises:
a sample and hold circuit 6A for storing a voltage value, known as $V_{GS}$,Miller, which is representative of the potential difference between the drive terminal and the source terminal when said power transistor 2A operates in the saturation region, that is when the Miller effect occurs, and
a gate discharge circuit 6B for generating an additional current "e" to discharge said capacitance $C_G$ of said gate terminal of said power transistor 2A during a first step of said power-off process, said second means 6B being controlled by a control signal EN_FD and said additional current "e" being a function of the difference between the voltage of said gate terminal and said voltage value $V_{GS}$,Miller.

The control circuitry 6 also includes a voltage differentiator 6C structured to detect the onset of the Miller effect when the power transistor operates in the saturation region, i.e. onset of the Miller effect during the power-off process.

The sample and hold circuit 6A includes a switch S3 configured to sample said voltage value $V_{GS}$,Miller and a capacitance C configured to store the sampled voltage value $V_{GS}$,Miller.

The gate discharge circuit 6B includes a differential amplifier 6E that is able to receive at its inverting input said sampled voltage value $V_{GS}$,Miller stored in the capacitance C and at its non-inverting terminal a value representative of the voltage of said drive terminal $V_G$ of said power transistor 2A, when said transistor operates in the triode region until reaching saturation (Miller effect).

The differential amplifier 6E is advantageously able to generate at its output a control signal Ictrl proportional to the difference of said sampled voltage value $V_{GS}$,Miller and the value representative of the voltage $V_G$ of said gate terminal.

It should be noted that the gate discharge circuit 6B includes a third current generator 13 which is controlled by the control signal Ictrl, said third generator being able to generate the additional current "e" as long as the control signal Ictrl is nonzero, i.e. as long as the voltage value of the gate terminal $V_G$, during the power-off step is below the sampled value $V_{GS}$,Miller.

In other words, the additional current "e" is proportional to the difference between the value representative of the gate terminal voltage $V_G$ and the sampled voltage value $V_{GS}$,Miller.

The control circuitry 6 also includes an overdrive block 6D, which is adapted to receive the sampled voltage value $V_{GS}$, Miller, i.e. when the power transistor operates in the so-called Miller zone, to provide an overdrive voltage $V_{OVDRV}$ to the gate terminal of the power transistor 2A in the power-on step.

Particularly, such overdrive block 6D is adapted to generate an overdrive voltage $V_{OVDRV}$ having a predetermined fixed value.

The value of such overdrive voltage shall be selected according to a number of parameters, including the technological process for making the power transistor 2A and especially according to gain.

It shall be noted that the control circuitry 6 further includes a first control logic block 6F, that can control:
the amount of charge at the terminals of the storage capacitance C, i.e. the sampled voltage value $V_{GS}$,Miller, and
a fourth current generator 14 controlled by a control signal EN_CH.

Particularly, the control signal EN_CH is enabled if the voltage value $V_{GS}$,Miller in the storage capacitance C is 0V, i.e. if no voltage value $V_{GS}$,Miller has been detected and sampled.

In this case, by using the control signal EN_CH to appropriately close a switch S4 interposed between the generator 14 and the storage capacitance C, the generator 14 will deliver the current for charging the capacitance C to a predetermined voltage.

For example, the generator 14 may be charging the capacitance until it reaches a voltage equal to or higher than the threshold voltage $V_{TH}$ for powering on the power transistor 2A.

In other words, the generator 14 can generate a current that is adapted to charge the capacitance C to a predetermined value equal to or higher than the voltage $V_{TH}$.

Also, still referring to FIG. 3, it shall be noted that the driver circuit 5 includes a second logical control block 6G, which is electrically connected with said control circuitry 6 and with said first and second current generators I1 and I2.

Particularly, the second control logic block 6G can receive a signal, such as a digital enabling signal QG for enabling operation of said power transistor 2A and an enabling signal ENABLE for controlling the operation of said control circuitry 6.

In other words, the second logical control block 6G supervises control of the driver circuit 5 by appropriately controlling the first and second current generators I1, I2, said logical control block 6G further controlling the control circuitry 6 through a plurality of control signals.

For this purpose, as shown in this FIG. 3, the logical control block 6G will provide for:
a first DER_NEG signal, that detects the presence of a negative derivative of voltage at the gate terminal during the power-off process, which signal comes from the differentiator 6C,
a second EN_FD signal, that can control operation of the differential amplifier 6B,
a third SAMPLE signal, that can control operation of the sample and hold circuit 6A, and hence of the switch S3, and
a fourth OVDRV_OK signal, that can detect when the gate terminal voltage reaches the desired overdrive value, during the transistor power-on process, which signal comes from said overdrive block 6D.

Having illustrated above the basic components of the driver circuit 5, the operation thereof will be now described.

Powering on the Power D-MOS (FIG. 4)

The driver circuit 5 is enabled through the logical block 6G according to the value of the ENABLE signal.

Particularly, when the ENABLE signal is high, the block 6F checks if the capacitor C is charged.

If the voltage on the capacitor C is 0V (which occurs when the voltage $V_{GS}$,Miller has not been sampled during the previous MOSFET transistor power-off step or upon Power-On, when all voltages are zero), then the EN_CH signal will become high and the switch S4 will be controlled to close, so that the capacitance C will be charged to a value equal to or higher than the threshold MOSFET power-on voltage $V_{TH}$.

For example, the capacitor C is charged by the current delivered by the current generator 14.

This provides an initial voltage to the capacitor C, and overdrive of the gate of the transistor 2A depends on its initial value.

As soon as the enabling QG signal becomes high, the switch S1 will be controlled to close (high CHARGE signal) and the gate terminal of the transistor 2A will be charged by the current Ion.

It shall be noted that there will be some delay at the time in which the QG signal is enabled, with respect to the ENABLE signal. Such delay is, for example, 400 nsec.

Since the input capacitance of the transistor 2A is small (due to the lack of any Miller effect) the gate voltage $V_G$ quickly reaches the threshold voltage value $V_{TH}$ at the onset of the Miller effect.

Since the drain current Id upon power-on is zero, the value $V_{GS}$,Miller is:

$$V_{GS_{Miller}} = V_{TH}$$

i.e. equal to the threshold voltage of the transistor.

Then, also referring to FIG. 4, the current Id starts flowing through the power transistor and the drain voltage decreases with a slope that, as mentioned above, is dependent on the current Ion, as shown in FIG. 4 during the period of time t1-t2.

This is caused by the Miller effect, which amplifies the input capacitance $C_G$ at the gate input terminal of the power transistor 2A; gate voltage in this step is substantially constant.

As the drain voltage reaches the value Vds,on (at time t2), the Miller effect ends and the input capacitance $C_G$ becomes small again.

Therefore, the gate voltage $V_G$ rises quickly to the fixed gate overvoltage, as related to the value sampled in the period of time in which the transistor is in the Miller zone during the previous switching cycle or anyway to the value stored in the capacitance.

Here, a voltage $V_{GS,ON}$ is found at the gate terminal, for powering on the power transistor 2A, which is equal to:

$$V_{GS,ON} = V_{GS},\text{Miller} + V_{OVDRV}.$$

When this condition is fulfilled, the OVDRV_OK signal becomes high and the switch S1 is controlled by the logic block 6G to open (low CHARGE signal). This reduced power consumption during power-on.

Powering Off the D-MOS of the Power Switch (FIG. 5)

As soon as the QG signal becomes low, the transistor 2A starts its power off process.

It shall be noted that, depending on the state of the EN_CH signal during power on, the drive circuit 5 may operate in two different modes, as described hereinbelow.

Rising Edge on the EN_CH Signal

This occurs if the voltage on the capacitor C is 0V.

In this condition, as explained above, the capacitor will be charged, for instance, to a voltage equal to or higher than the threshold voltage $V_{TH}$, by closing the switch S4 and coupling the current generator 14 to the capacitor C.

When the QG signal becomes low, also referring to FIG. 5, the switch S2 is controlled to close (high DISCHARGE value at the time t1) and the gate capacitance $C_G$ of the gate terminal of the transistor 2A will be discharged.

At first, as the gate terminal voltage decreases, the bias point of the power transistor 2A is stationary, due to the inductive load 1 which may be assimilated to a constant current supply.

In this case, the output signal DER_NEG, from the voltage differentiator 6C, is high due to the negative slope of the gate terminal voltage $V_G$.

At the time t2, the power transistor 2A enters the saturation region: the drain voltage starts to rise, the Miller effect occurs and the gate voltage is approximately constant.

In these conditions, the DER_NEG signal becomes low (zero derivative of the gate voltage), the gate voltage $V_G$ is sampled by the switch S3 and maintained on the capacitor C.

At the time t3, the transistor will power off, the drain voltage will reach the maximum value, which is equal to the power supply voltage Vin, and the drain current will drop to zero. As a result, since the Miller effect has ended, the gate voltage falls quickly.

No Event on the EN_CH Signal

This occurs if the voltage on the capacitor C is nonzero, i.e. if Miller voltage sampling during the previous cycle was successful.

In this case, when the QG signal becomes low, the EN_FD signal becomes high and quick discharge is enabled through the gate discharge circuit 6B.

The input signals for this block, as mentioned above are the voltage $V_{GS}$,Miller sampled in the previous switching cycle and the gate voltage $V_G$.

Particularly, the block 6B generates the current "e", which is proportional to the difference of the gate voltage $V_G$ and the voltage value sampled in the previous switching cycle, from the voltage on the source terminal.

In other words, the current "e" is:

$$e=k(V_G-V_{GS},\text{Miller})$$

where k is the gain, and has the function of discharging the gate with a current proportional to the error. Therefore, as the $V_G$ decreases, the discharging current also decreases.

Once the error is reset, the transistor will operate in the Miller region (which is detected by the voltage differentiator 6C), quick discharge stops and the gate terminal of the MOSFET 2A is discharged slowly, as explained above.

By the above arrangement, the transistor gate may be driven to quickly reach the voltage in which the Miller effect occurs, where the drain voltage slope may be controlled. This purpose was fulfilled using:

the value $V_{GS}$,Miller stored in the capacitance C during the previous switching cycle, which indicates the voltage between the gate and source terminals at which, depending on the transistor threshold VTH and the power off current, the Miller effect occurs;

quick discharge of the input capacitance of the transistor, through the error amplifier 6E and the driven current generator 13, until the Miller zone is reached, where the error is reset;

the voltage differentiator 6C, which detects voltage changes at the gate terminal and the onset of the Miller effect, where the derivative is zero;

the I2 generator, whose current Ioff adjusts the drain voltage slope.

Figure 1A:
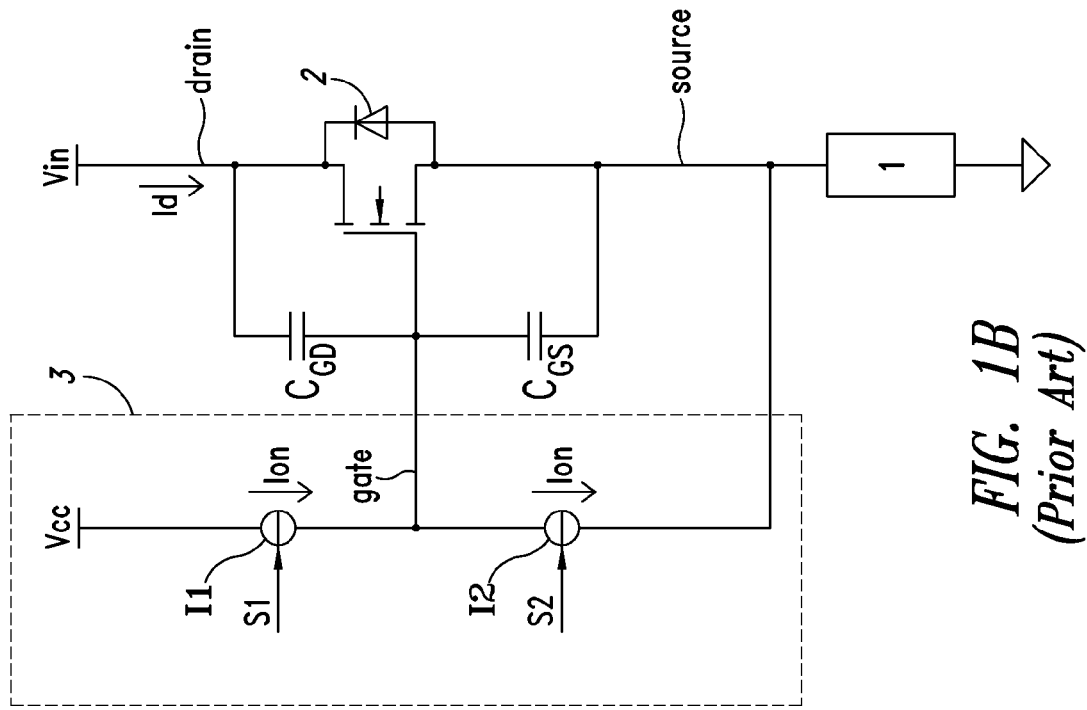
FIGS. 1a and 1b is a schematic of a driver circuit according to the prior art.
Figure 1B:
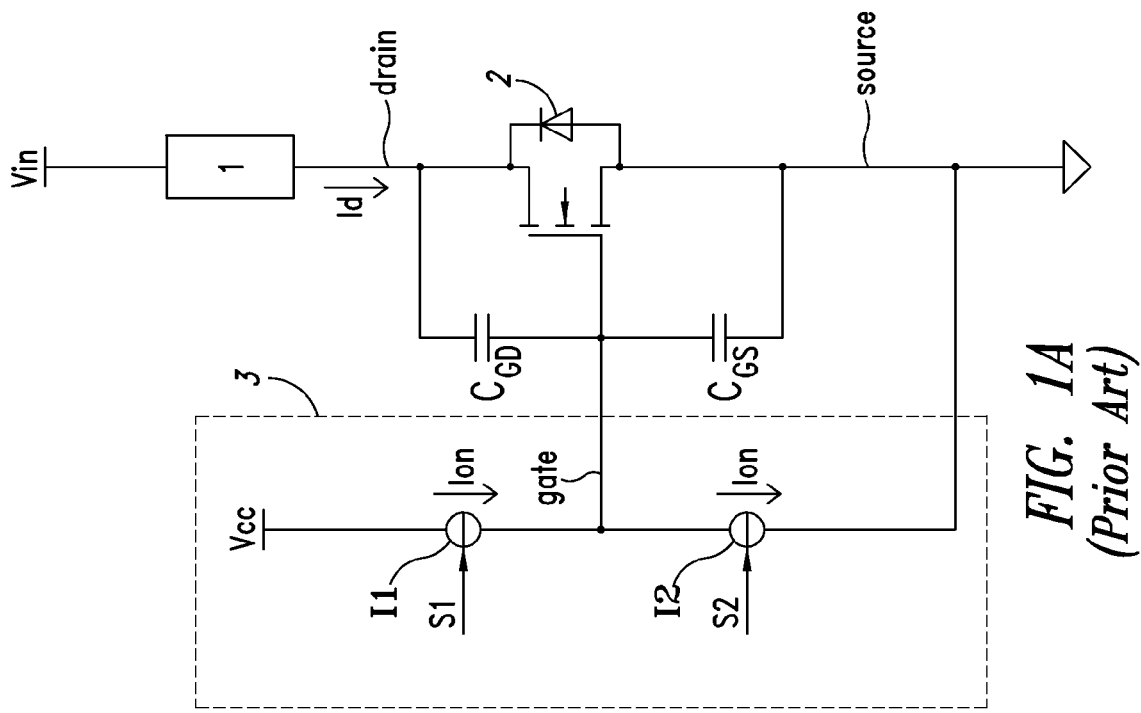
Figure 2:
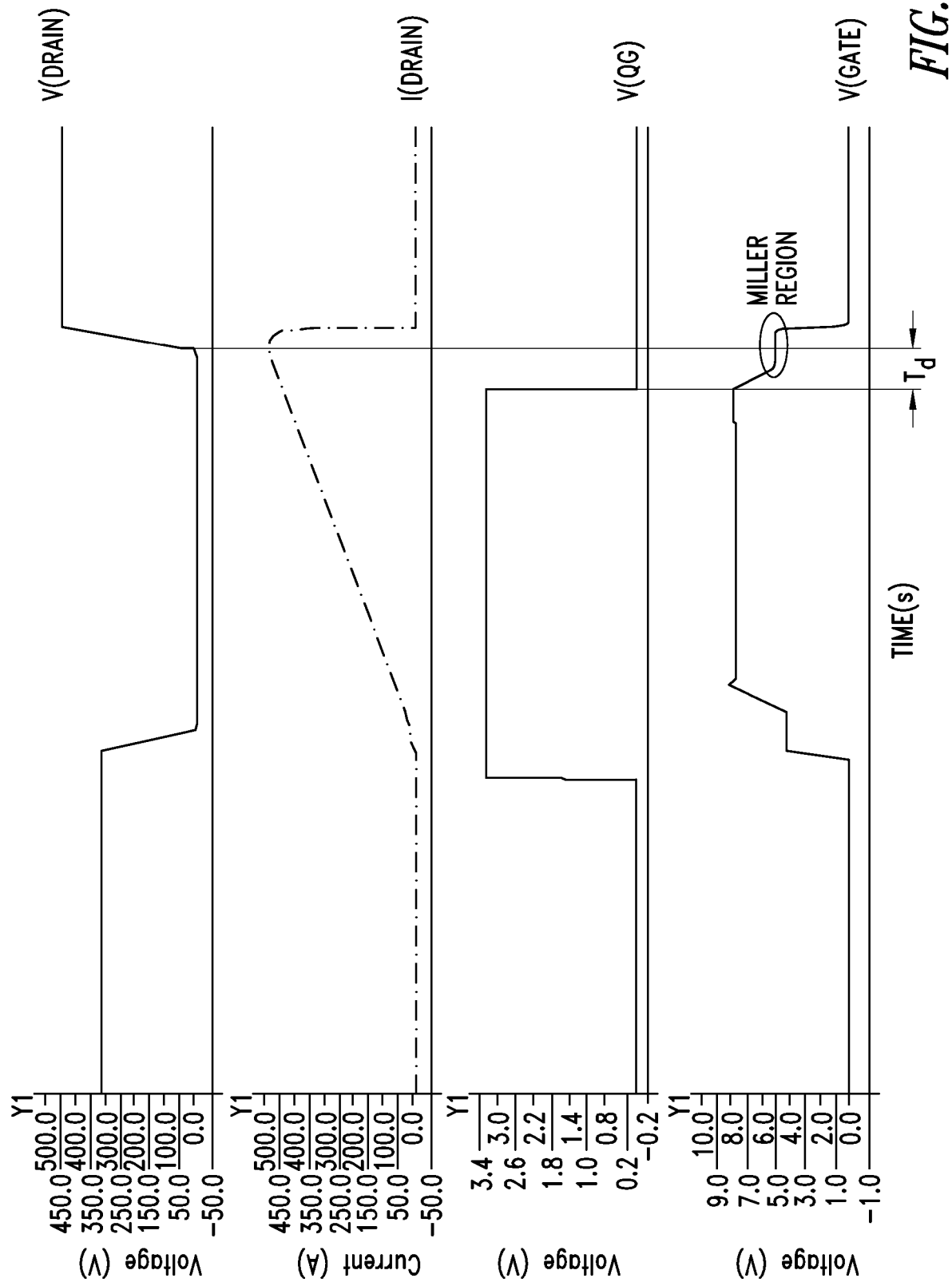
Figure 7:
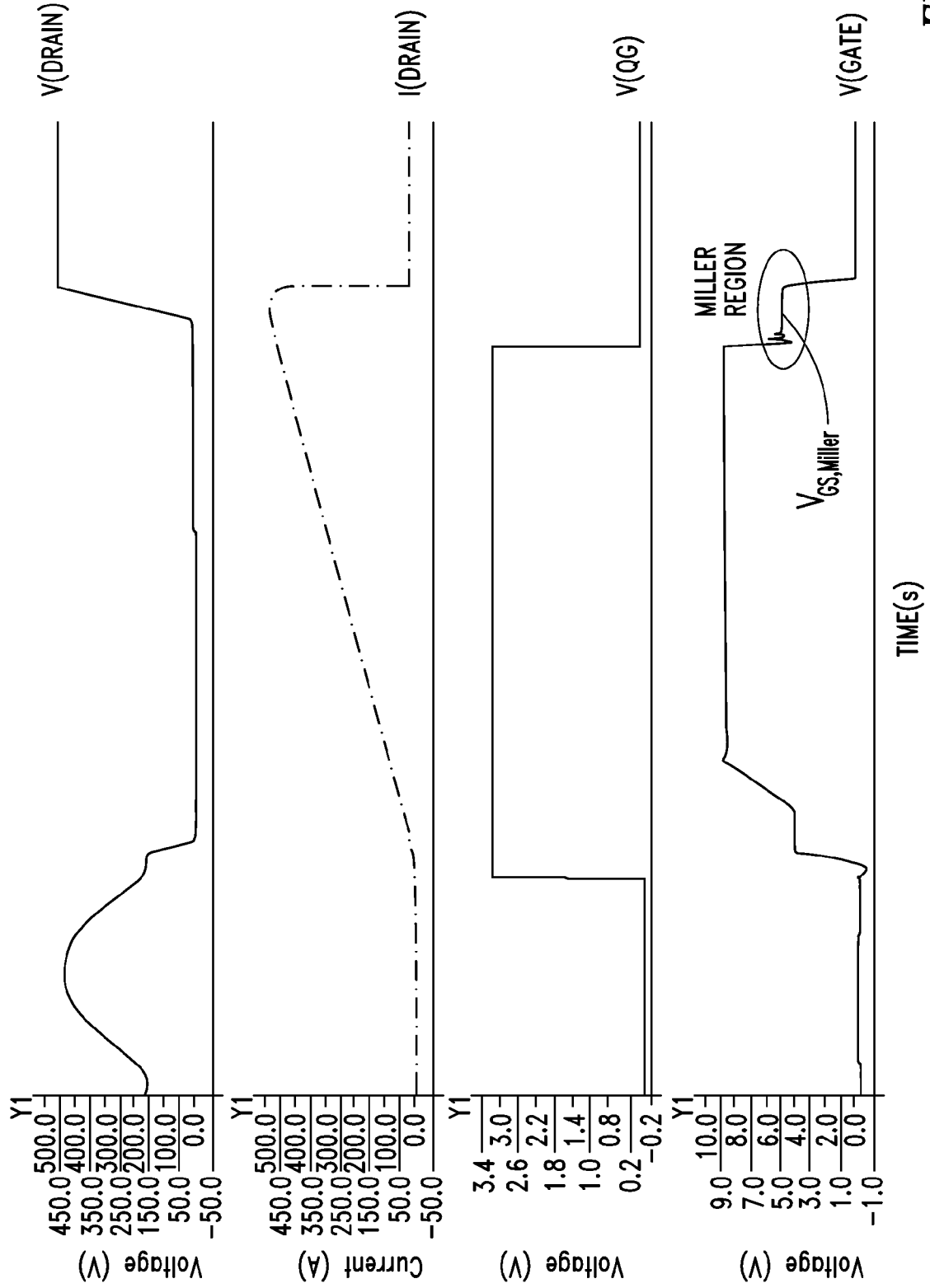
FIG. 7 shows further switching waveforms for the driver circuit as shown in FIG. 3.

FIG. 7 shows the power off waveforms for the latter case, with the period of time Td being smaller than as shown in FIG. 2, concerning the prior art.

The voltage value $V_{GS}$,Miller, as mentioned above, is dependent on the peak drain current at which the power MOSFET is powered off.

In view of the above, the control circuitry 6 is useful to detect when the transistor 2A operates in the saturation zone, i.e. when it is in the so-called Miller zone (see FIG. 7).

For this purpose, the voltage "differentiator" block 6C is advantageously used to detect the negative derivatives of the voltage between the gate and source terminals of the power transistor 2A, to determine the time at which the Miller effect occurs and drive $V_{GS}$,Miller sampling, to store it in the capacitance C, after switching of the switch S3.

This can occur because the frequency of the control signal, which generally sets the maximum current peak for power off, is considerably lower than the switching frequency of the power transistor 2A. Therefore the peak drain current $I_d$ can be deemed to be constant, cycle after cycle.

As a result, the voltage value $V_{GS}$,Miller, which depends on the drain current, may be also deemed as constant cycle after cycle.

Therefore, if this value is sampled during a cycle, then the voltage between the gate and the source to be quickly reached in the next cycle, i.e. $V_{GS}$,Miller, whereat the Miller effect occurs, is known and the switching speed can be controlled.

Therefore, at the start of the power off process, the gate discharge circuit 6B is enabled, to quickly discharge the gate of the power MOSFET 2A using the absorption current "e".

As soon as the difference is zero, quick discharge is stopped and the gate is discharged by the constant current $I_{OFF}$, with the drain voltage slope being controlled.

Figure 6:
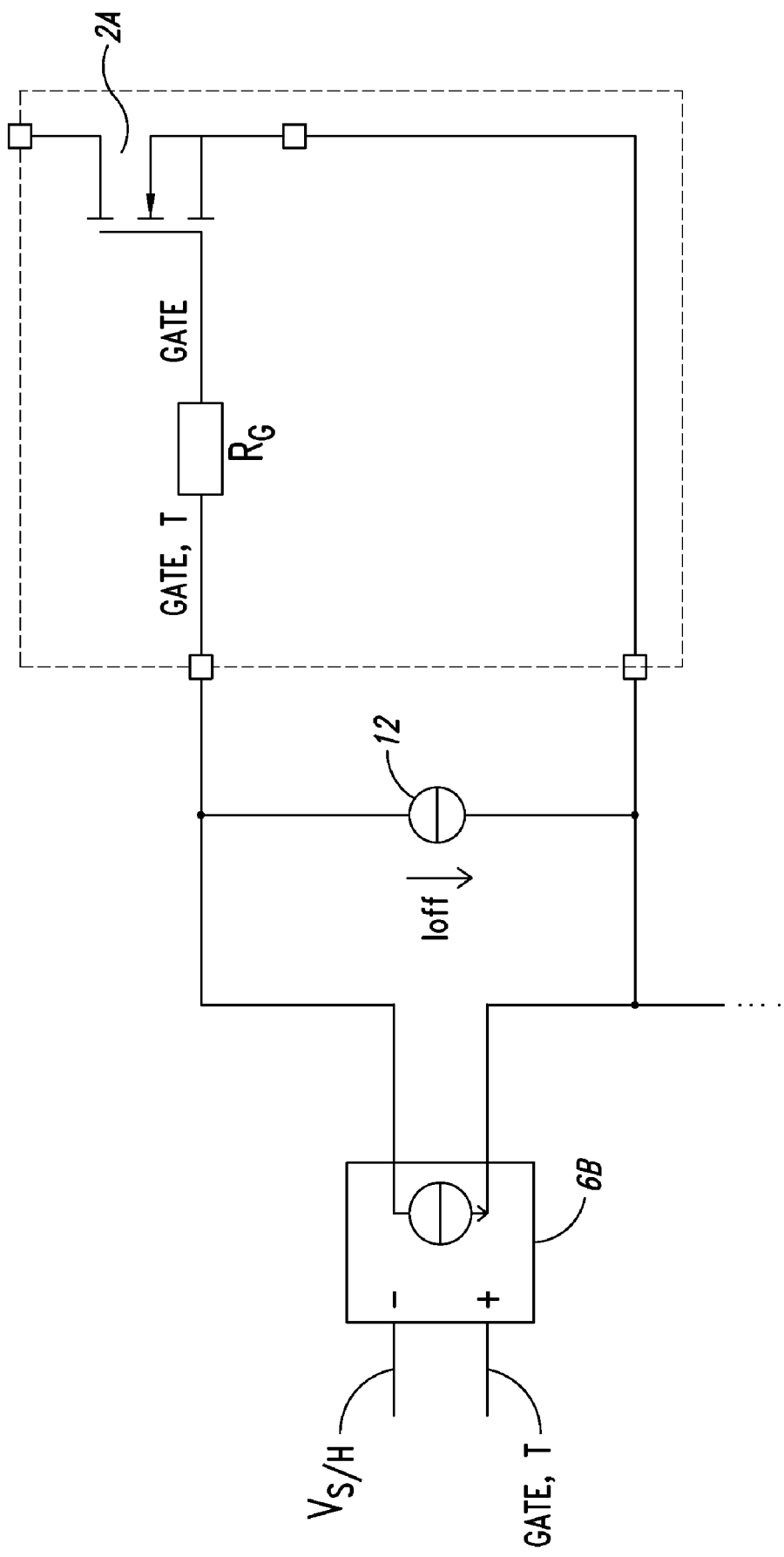
FIG. 6 is a schematic of a portion of the circuit of FIG. 3, when it is in a particular operating state, to compensate for the gate terminal resistance effect.

Discharge of the gate terminal of the transistor 2A with a current "e" proportional to the error minimizes the effect of gate resistance $R_G$ (see FIG. 6). Referring to FIG. 6, which shows a block diagram of a portion of the circuit of FIG. 3, as the capacitance $C_o$ of the gate terminal of the power transistor 2A is quickly discharged, a high current is absorbed and the voltage $V_{GATE,T}$ that is measured on the gate terminal is influenced by the voltage drop at the ends of the gate resistance $R_G$.

Considering that current decreases with the gate voltage $V_G$, the voltage at the ends of the resistance $R_G$ drops to the minimum value, i.e. ($R_G*I_{OFF}$), corresponding to the state in which no difference exists between the voltage on the gate terminal $V_{GATE,T}$ and the stored voltage $V_{S/H}$ (i.e. detected and sampled by the differentiator 6C and the capacitance C respectively).

Therefore, the error caused by the gate resistance effect is of little importance, equal to the voltage drop due to the ends of the gate resistance and the discharge current ($R_G*I_{GFF}$). As a result, the actual sampled and maintained value is $V_{S/H}=V_{GS}$,Miller+($R_G*I_{OFF}$).

Nonetheless, this error is common mode; thus, once into the Miller zone, with quick discharge being stopped, the following conditions occur:

$$v_{GATE,T}-V_{S/H}=v_{GATE}+R_G \cdot I_{OFF}-(v_{GS,\text{Miller}}+R_G \cdot I_{OFF})=0$$
$$\Rightarrow v_{GATE}-v_{GS,\text{Miller}}=0$$

Furthermore, the value $V_{GS}$,Miller is used as a reference to provide the fixed overdrive voltage $V_{OVDRV}$ to the gate terminal of the power transistor 2A during power on.

Thus, an adaptive voltage $V_{GS,ON}$ is provided for powering on the power MOSFET 2A, i.e. dependent on the threshold voltage $V_{TH}$ and the drain current $I_D$. This provides optimized power consumption.

With reference to the block diagram of the driver circuit 5, as shown $$v_{GS_{Miller}} = \frac{I_d}{g_m} + v_{TH}$$

in FIG. 3, the MOSFET power on process appears to be slow.

Therefore, this solution might be used, for instance, in PWM switching controllers which operate in zero current switching mode during MOSFET power on.

Nonetheless, the same technique for sampling and maintaining the voltage value might be used in an exactly identical manner, to accelerate power on of the transistor 2A if the driver circuit 5 is used, for example, in a continuously operating PWM switching controller.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A driver circuit for switching a load through a power transistor comprising:
    a first current generator configured to be controlled by a first signal and structured to charge a capacitance of a control terminal of said power transistor during power on of said power transistor by generating a charge current;
    a second current generator configured to be controlled by a second signal, said second generator being structured to discharge said capacitance of said control terminal of said power transistor during power off of said power transistor by generating a first discharge current;
    a control circuit electrically coupled to said second current generator and configured to be coupled to said control terminal of said power transistor, said control circuit comprising:
        a storage element structured to store a voltage value, which is representative of a potential difference between said control terminal and a conduction terminal of said power transistor when said power transistor operates in a saturation region, and
        a discharge circuit structured to discharge said capacitance of said control terminal of said power transistor during said power off process by generating a second discharge current, said second discharge current being a function of said stored voltage value, wherein the storage element is part of a sample and hold circuit configured to sample the potential difference between said drive terminal and a conduction terminal of said power transistor when said power transistor operates in the saturation region.

2. A driver circuit as claimed in claim 1, wherein:
    said storage element includes a capacitance positioned between an intermediate node and a ground terminal;
    the control circuit further includes a voltage differentiator structured to detect said voltage value; and
    the sample and hold circuit includes a first switch positioned between the intermediate node and the control terminal of the power transistor and configured to sample said voltage value into the capacitance of the storage element.

3. A driver circuit as claimed in claim 2, wherein said control circuit further comprises:
    a third current generator;
    a second switch coupled to the third current generator; and
    a logical control block configured to, in response to detecting that a voltage in said capacitance of said storage element is zero, control said second switch into enabling the third current generator to charge said capacitance to a voltage equal to or higher than a threshold voltage of said power transistor.

4. A driver circuit as claimed in claim 2, wherein said first switch has a control terminal coupled to the voltage differentiator, the first switch being configured to sample the voltage value into the capacitance in response to the voltage differentiator detecting the voltage value.

5. A driver circuit as claimed in claim 1, wherein said discharge circuit includes:
    a third current generator structured to generate the additional current; and
    a differential amplifier having a first input configured to receive said voltage value, a second input configured to receive a value representative of a voltage of said control terminal of said power transistor, and an output, the differential amplifier being structured to generate at its output a control signal for actuating the third generator to deliver said second discharge current as long as said control signal is nonzero.

6. A driver circuit as claimed in claim 5, wherein said storage element includes a capacitance, the sample and hold circuit is configured to sample said voltage value into the capacitance, and the control circuit further includes a voltage differentiator structured to detect said voltage value, the driver circuit further comprising:
    first and second switches coupled to said first and second current generators, respectively;
    a logical control block coupled to said control circuitry and said first and second switches, said logical control block being configured to receive a first enabling signal for enabling said power transistor and a second enabling signal for enabling said logical control block to control operation of said control circuitry, said logical control block being configured to control:
    said first and second current generators via first and second control signals controlling the first and second switches respectively,
    said differential amplifier by a third control signal, and
    said sample and hold circuit by a fourth control signal, which in turn depends on a fifth control signal from said voltage differentiator.

7. A driver circuit as claimed in claim 1, wherein said control circuit comprises an overdrive block configured to receive said voltage value and provide an overdrive voltage to said control terminal of said power transistor.

8. A driving method, comprising:
    switching a load through a power transistor having a control terminal;
    generating a first discharging current;
    detecting a time at which a voltage between said control terminal and a conduction terminal of said power transistor is such that the power transistor operates in the saturation region;
    sampling said voltage into a storage element;

generating a second discharging current proportional to a difference between said sampled voltage and a voltage of said control terminal;

discharging the control terminal using the first and second discharging currents; and stopping said second discharging current in response to detecting that said difference becomes zero.

9. A driving method as claimed in claim 8, comprising:
detecting that said storage element has a voltage of zero;
in response to detecting that the voltage in said storage element is zero, generating a charging current for charging said capacitance to a selected voltage equal to or higher than a threshold voltage of said power transistor; and
stopping said charging current in response to detecting that said selected voltage has been reached.

10. A driving method as claimed in claim 8, comprising powering on said power transistor by providing a voltage to the control terminal, which is equal to a sum of said selected voltage and an overdrive voltage.

11. A power circuit for driving a load, comprising:
a power transistor configured to be coupled to the load, the power transistor including a parasitic capacitance; and
a drive circuit coupled to the power transistor and configured to drive the power transistor, the drive circuit including:
  a first current generator configured to be controlled by a first signal and structured to charge the parasitic capacitance of a control terminal of said power transistor during power on of said power transistor by generating a charge current;
  a second current generator controlled by a second signal, said second generator being structured to discharge said parasitic capacitance of said control terminal of said power transistor during power off of said power transistor by generating a first discharge current; and
  a control circuit electrically coupled to said second current generator and to said control terminal of said power transistor, said control circuit comprising:
    a storage element structured to store a voltage value, which is representative of a potential difference between said drive terminal and a conduction terminal of said power transistor when said power transistor operates in a saturation region, wherein said storage element includes a capacitance positioned between an intermediate node and a ground terminal;
    a discharge circuit structured to discharge said capacitance of said control terminal of said power transistor during said power off process by generating a second discharge current, said second discharge current being a function of said stored voltage value;
    a voltage differentiator structured to detect said voltage value; and
    a first switch positioned between the intermediate node and the control terminal of the power transistor and configured to sample said voltage value into the capacitance of the storage element.

12. A power circuit as claimed in claim 11, wherein said control circuit further comprises:
a third current generator;
a second switch coupled to the third current generator; and
a logical control block configured to, in response to detecting that a voltage in said capacitance is zero, control said second switch into enabling the third current generator to charge said capacitance to a voltage equal to or higher than a threshold voltage of said power transistor.

13. A power circuit as claimed in claim 11, wherein said first switch has a control terminal coupled to the voltage differentiator, the first switch being configured to sample the voltage value into the capacitance in response to the voltage differentiator detecting the voltage value.

14. A power circuit as claimed in claim 11, wherein said discharge circuit includes:
a third current generator structured to generate the additional current; and
a differential amplifier having a first input configured to receive said voltage value, a second input configured to receive a value representative of a voltage of said control terminal of said power transistor, and an output, the differential amplifier being structured to generate at its output a control signal for actuating the third generator to deliver said second discharge current as long as said control signal is nonzero.

15. A power circuit as claimed in claim 14, wherein the control circuit further includes a voltage differentiator structured to detect said voltage value, the driver circuit further comprising:
second and third switches coupled to said first and second current generators, respectively;
a logical control block coupled to said control circuitry and said second and third switches, said logical control block being configured to receive a first enabling signal for enabling said power transistor and a second enabling signal for enabling said logical control block to control operation of said control circuitry, said logical control block being configured to control:
said first and second current generators via first and second control signals controlling the first and second respectively,
said differential amplifier by a third control signal, and
said first switch by a fourth control signal, which in turn depends on a fifth control signal from said voltage differentiator.

16. A power circuit as claimed in claim 11, wherein said control circuit comprises an overdrive block configured to receive said voltage value and provide an overdrive voltage to said control terminal of said power transistor.

17. A power circuit as claimed in claim 11, wherein said control terminal of the transistor is a gate and the conduction terminal is a source.

18. A driver circuit for controlling a power transistor comprising:
a first current generator configured to charge a capacitance of a control terminal of said power transistor during power on of said power transistor by generating a charge current;
a second current generator configured to discharge said capacitance of said control terminal of said power transistor by generating a first discharge current through a first discharge current path during power off of said power transistor;
a control circuit configured to be coupled to said control terminal of said power transistor, said control circuit including:
a storage element configured to store a Miller voltage of said power transistor; and
a detector circuit configured to detect that the power transistor has reached a Miller zone during the power off of said power transistor;
a fast discharge circuit structured to compare a voltage of the control terminal of the power transistor with the Miller voltage stored in the storage element, discharge the capacitance of said control terminal of said power transistor by generating a second discharge current through a second discharge current path, and stop the second discharge current in response to the detector circuit detecting that the power transistor has reached the Miller zone.

19. A driver circuit as claimed in claim 18, wherein the control circuit includes an overdrive circuit structured to drive the power transistor in triode region by providing to the gate of the power transistor a voltage that is a sum of the Miller voltage stored in the storage element and a fixed overdrive voltage.

20. A driver circuit as claimed in claim 18, wherein said storage element includes a capacitance and said control circuit further comprises:
    a third current generator configured to provide a second charge current;
    a switch coupled to the third current generator; and
    a logical control block configured to, in response to detecting that a voltage in said capacitance of the storage element is zero, control said switch into enabling the third current generator to charge said capacitance of the storage element to a voltage equal to or higher than a threshold voltage of said power transistor.

21. A driver circuit as claimed in claim 18, wherein said control circuit further comprises a switch having a control terminal coupled to the detector circuit, the switch being configured to sample a voltage of the control terminal into the capacitance of the storage element in response to the detection circuit detecting that the power transistor has reached the Miller zone during the power off of said power transistor.

22. A driver circuit as claimed in claim 18, further comprising:
    an output node configured to be coupled to the control terminal of the power transistor; and
    a ground terminal, wherein:
    the first current path extends between the output node and the ground terminal and includes the second current generator and a switch;
    the second current path extends between the output node and the ground terminal and includes a third current generator of the fast discharge circuit; and
    the control circuit includes a control logic block configured to control the switch and the fast discharge circuit and cause the second and third current generators to simultaneously provide the first and second discharge currents from the output node to the ground terminal.

23. A driver circuit for switching a load through a power transistor comprising:
    a first current generator configured to be controlled by a first signal and structured to charge a capacitance of a control terminal of said power transistor during power on of said power transistor by generating a charge current;
    a second current generator configured to be controlled by a second signal, said second generator being structured to discharge said capacitance of said control terminal of said power transistor during power off of said power transistor by generating a first discharge current;
    a control circuit electrically coupled to said second current generator and configured to be coupled to said control terminal of said power transistor, said control circuit comprising:
        a storage element structured to store a voltage value, which is representative of a potential difference between said control terminal and a conduction terminal of said power transistor when said power transistor operates in a saturation region, wherein said storage element includes a capacitance positioned between an intermediate node and a ground terminal;
        a discharge circuit structured to discharge said capacitance of said control terminal of said power transistor during said power off process by generating a second discharge current, said second discharge current being a function of said stored voltage value;
        a voltage differentiator structured to detect said voltage value; and
        a switch positioned between the intermediate node and the control terminal of the power transistor and configured to sample said voltage value into the capacitance of the storage element.

24. A driver circuit as claimed in claim 23, wherein said control circuit further comprises:
    a third current generator;
    a switch coupled to the third current generator; and
    a logical control block configured to, in response to detecting that a voltage in said capacitance of said storage element is zero, control said switch into enabling the third current generator to charge said capacitance to a voltage equal to or higher than a threshold voltage of said power transistor.

25. A driver circuit as claimed in claim 23, wherein said first switch has a control terminal coupled to the voltage differentiator, the first switch being configured to sample the voltage value into the capacitance in response to the voltage differentiator detecting the voltage value.

26. A driver circuit for switching a load through a power transistor comprising:
    a first current generator configured to be controlled by a first signal and structured to charge a capacitance of a control terminal of said power transistor during power on of said power transistor by generating a charge current;
    a second current generator configured to be controlled by a second signal, said second generator being structured to discharge said capacitance of said control terminal of said power transistor during power off of said power transistor by generating a first discharge current;
    a control circuit electrically coupled to said second current generator and configured to be coupled to said control terminal of said power transistor, said control circuit comprising:
        a storage element structured to store a voltage value, which is representative of a potential difference between said control terminal and a conduction terminal of said power transistor when said power transistor operates in a saturation region;
        a discharge circuit structured to discharge said capacitance of said control terminal of said power transistor during said power off process by generating a second discharge current, said second discharge current being a function of said stored voltage value; and
        an overdrive block configured to receive said voltage value and provide an overdrive voltage to said control terminal of said power transistor.

27. A driver circuit as claimed in claim 26, wherein said storage element includes a capacitance positioned between an intermediate node and a ground terminal, the control circuit further comprising:
    a voltage differentiator structured to detect said voltage value; and a switch positioned between the intermediate node and the control terminal of the power transistor and configured to sample said voltage value into the capacitance of the storage element.

28. A power circuit for driving a load, comprising:
a power transistor configured to be coupled to the load, the power transistor including a parasitic capacitance; and
a drive circuit coupled to the power transistor and configured to drive the power transistor, the drive circuit including:
  a first current generator configured to be controlled by a first signal and structured to charge the parasitic capacitance of a control terminal of said power transistor during power on of said power transistor by generating a charge current;
  a second current generator controlled by a second signal, said second generator being structured to discharge said parasitic capacitance of said control terminal of said power transistor during power off of said power transistor by generating a first discharge current; and
  a control circuit electrically coupled to said second current generator and to said control terminal of said power transistor, said control circuit comprising:
    a storage element structured to store a voltage value, which is representative of a potential difference between said drive terminal and a conduction terminal of said power transistor when said power transistor operates in a saturation region, and
    a discharge circuit structured to discharge said capacitance of said control terminal of said power transistor during said power off process by generating a second discharge current, said second discharge current being a function of said stored voltage value, wherein the storage element is part of a sample and hold circuit configured to sample the potential difference between said drive terminal and a conduction terminal of said power transistor when said power transistor operates in the saturation region.

29. A power circuit as claimed in claim 28, wherein:
said storage element includes a capacitance positioned between an intermediate node and a ground terminal;
the control circuit further includes a voltage differentiator structured to detect said voltage value; and
the sample and hold circuit includes a first switch positioned between the intermediate node and the control terminal of the power transistor and configured to sample said voltage value into the capacitance of the storage element.

30. A power circuit as claimed in claim 29, wherein said control circuit further comprises:
a third current generator;
a second switch coupled to the third current generator; and
a logical control block configured to, in response to detecting that a voltage in said capacitance of said storage element is zero, control said second switch into enabling the third current generator to charge said capacitance to a voltage equal to or higher than a threshold voltage of said power transistor.

31. A power circuit as claimed in claim 29, wherein said first switch has a control terminal coupled to the voltage differentiator, the first switch being configured to sample the voltage value into the capacitance in response to the voltage differentiator detecting the voltage value.

* * * * *